United States Patent
Yoshino et al.

(10) Patent No.: US 8,170,134 B2
(45) Date of Patent: May 1, 2012

(54) TRANSMITTER AND A METHOD FOR DUPLICATING SAME

(75) Inventors: Hiroki Yoshino, Musashino (JP); Etsutaro Koyama, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 804 days.

(21) Appl. No.: 11/078,513

(22) Filed: Mar. 14, 2005

(65) Prior Publication Data
US 2005/0237232 A1 Oct. 27, 2005

(30) Foreign Application Priority Data
Apr. 23, 2004 (JP) .................................. 2004-127875

(51) Int. Cl.
*H04L 27/00* (2006.01)
(52) U.S. Cl. ........ 375/295; 375/219; 375/229; 375/232; 375/350; 342/82; 367/137
(58) Field of Classification Search .................. 375/295; 342/82; 367/137
See application file for complete search history.

(56) References Cited

U.S. PATENT DOCUMENTS

| | | | | |
|---|---|---|---|---|
| 4,282,405 A | * | 8/1981 | Taguchi | 704/217 |
| 4,636,838 A | * | 1/1987 | Cosh | 348/592 |
| 4,829,577 A | * | 5/1989 | Kuroda et al. | 704/244 |
| 5,226,091 A | * | 7/1993 | Howell et al. | 382/107 |
| 5,586,204 A | * | 12/1996 | Noble et al. | 382/282 |
| 6,757,865 B1 | * | 6/2004 | Nakamura et al. | 714/796 |
| 7,130,342 B2 | * | 10/2006 | Buckley et al. | 375/229 |

FOREIGN PATENT DOCUMENTS

JP 2002-204173 A 7/2002

OTHER PUBLICATIONS

Tokuji Saigusa et al., Yokogawa Technical Report English Edition, No. 15 (1992) Dpharp Series Electronic Differential Pressure Transmitters.

* cited by examiner

*Primary Examiner* — Shuwang Liu
*Assistant Examiner* — Lihong Yu
(74) *Attorney, Agent, or Firm* — Westerman, Hattori, Daniels & Adrian, LLP

(57) ABSTRACT

The present invention is intended to realize a transmitter whose internal signal processing function can be duplicated without having to add any hardware components. The transmitter converts an input signal into an output signal using a plurality of calculation steps, comprising a backward calculation means for executing the plurality of calculation steps in reverse direction.

11 Claims, 5 Drawing Sheets

TRANSMITTER AND A METHOD FOR DUPLICATING SAME

BACKGROUND OF THE INVENTION

1. Field of the Invention

The present invention relates to a transmitter for converting process variable-related input signals into predetermined output signals by means of multistep calculation and to a method for duplicating the transmitter.

2. Description of the Prior Art

Prior art documents related to a transmitter for converting process variable-related input signals into predetermined output signals by means of multistep calculation, such as a vibrating differential pressure transmitter, include the following:

Non-patent document: "DPharp Electronic Differential Pressure Transmitters" *Yokogawa Technical Report* Vol. 36 No. 1 (1992) pp. 21-28

The standardization of safety instrumented systems (SIS) is being promoted recently for protection against bodily injury as well as environmental and equipment protection. As a result, there is a market demand for transmitters that satisfy safety integrity level (SIL) 2 (i.e., the risk reduction factor (RRF), which is the inverse number of the probability of failure on demand, is in the range of 100 to 1000).

As a rule, two or more transmitters are used for a system for which safety and reliability are required, in order to meet such a market demand.

If a sensor is highly reliable and is not required to be dual-redundant, the transmitter itself may be singular and the signal processing function thereof may be duplicated. FIG. 1 is a functional block diagram illustrating an example of a prior art differential pressure transmitter having duplicated internal signal processing functions.

Area A enclosed by a broken chain line denotes a two-wire differential pressure transmitter. The differential pressure transmitter is given an input of process variable PV (pressure, differential pressure, etc.), transmits 4-20 mA current output signal Io, and has the functions to communicate with a host computer, notify the transmitter's own failure and obtain information from the host computer.

In differential pressure transmitter A, numeral 1 denotes a vibrating pressure sensor for outputting two frequency signals-related process variable (PV). Since the structure and operating principle of this sensor are disclosed in non-patent document 1 mentioned earlier, they are not explained further.

Numerals 2 and 3 denote dual-redundant first and second counters, respectively, to which the two frequency signals are respectively input from pressure sensor 1 and counted. Numerals 4 and 5 denote dual-redundant first and second microprocessors, to which pulse signals are input from first counter 2 and second counter 3 respectively and calculated.

In first microprocessor 4, numeral 41 denotes a first calculation means for generating calculated output Do1 by performing multistep calculation and pulse width modulation on a pulse signal from first counter 2. Likewise, numeral 51 in second microprocessor 5 denotes a second calculation means for generating calculated output Do2 by performing multistep calculation and pulse width modulation on a pulse signal from second counter 3.

Numeral 6 denotes an EEPROM for retaining coefficients or the like to be referenced during corrective calculations performed by first calculation means 41. ROM7 and RAM8 are memory means used for calculations performed by first calculation means 41. Likewise, numeral 9 denotes an EEPROM for retaining coefficients or the like to be referenced during corrective calculations performed by second calculation means 51. ROM10 and RAM11 are memory means used for calculations performed by second calculation means 51.

First microprocessor 4 is a main processor. Under normal conditions, calculated output Do1 of first calculation means 41 in this processor is converted into current output signal Io and transmitted. Second microprocessor 5 is a slave microprocessor and calculated output Do2 of second calculation means 51 in this processor functions only for the purpose of checking agreement with calculated output Do1 of first microprocessor 4.

In first microprocessor 4, numeral 42 denotes a comparator and calculated output Do1 of first calculation means 41 and calculated output Do2 of second calculation means 51 are input to comparator 42. Then, agreement between outputs Do1 and Do2 are checked under predetermined conditions. If any discrepancy is found between these two outputs, alarm command AL is output.

Numeral 43 denotes an output selector for selecting calculated output Do1 of first calculation means 41 under normal conditions. Upon receipt of alarm command AL from comparator 42, output selector 43 selects burn-out signal Da from alarm signal generator 44 and inputs the signal to output means 12. Numeral 13 denotes an indicator for processing information provided by first microprocessor 4.

Under the normal conditions in which calculated output Do1 of first calculation means 41 is input through output selector 43, output means 12 converts digital calculated output Do1 into an analog value, generates current output signal Io having a 4-20 mA span, and transmits the signal to external transmission line 14.

Under the abnormal conditions in which burn-out signal Da is input from alarm signal generator 44 through output selector 43, output means 12 converts digital burn-out signal Da into an analog value, generates a 3.2 mA or 21.6 mA burn-out current output signal and transmits the signal to external transmission line 14.

Numeral 15 denotes an external DC power supply inserted in transmission line 14, numeral 16 denotes a maintenance-purpose portable communicator connected to transmission line 14, and numeral 17 denotes a host computer also connected to transmission line 14. Numeral 18 denotes a communication interface connected to output means 12. Communication interface 18 communicates with first microprocessor 4, informs host computer 17 of the occurrence of failure using a digital signal superimposed on transmission line 14, and obtains various types of information from the host computer.

Next, the details of multistep calculation performed at first calculation means 41 and second calculation means 51 will be explained by taking first calculation means 41 as a representative example. First, sensor frequencies fc and fr are calculated from pulse signals provided by first counter 2.

In first-step calculation 41a, differential pressure signal X is calculated according to the following equation using calculated fc and fr and constants A, B and C representing sensor characteristics.

$$X = A \cdot f_c^2 + B \cdot f_r^2 + C \qquad \text{(Eq. 1-1)}$$

In second-step calculation 41b, temperature- and static pressure-corrected differential pressure dpcomp is calculated as a nth-order polynomial of X according to the following equation, by using the calculated value of X and temperature- and static pressure-dependent dynamic correction factor ki stored in EEPROM 6.

$$dpcomp = \sum_{i=0}^{m} k_t \cdot X^i \quad \text{(Eq. 1-2)}$$

In third-step calculation 41$c$, differential pressure dpscaled having been scaled to user-specified ranges urv (100%) and lrv (0%) is calculated for the calculated value of dpcomp, according to the following equation.

$$dpscaled = \frac{dpcomp - lrv}{urv - lrv} \quad \text{(Eq. 1-3)}$$

In fourth-step calculation 41$d$, digital signal pwm to be pulse-modulated is calculated according to the following polynomial, using the calculated value of dpscaled and temperature-dependent dynamic correction factor Ci stored in EEPROM 6:

$$pwm = \sum_{i=0}^{n} c_i \cdot dpscaled^i \quad \text{(Eq. 1-4)}$$

The value of digital signal pwm calculated through the four steps discussed above is input to comparator 42 as calculated output Do1 of the first microprocessor, as well as to output means 12 through output selector 43, and converted into 4-20 mA current output signal Io.

Calculations based on a plurality of calculation steps 51$a$ to 51$d$ executed by second calculation means 51 in second microprocessor 5, to which pulse signals are input from second counter 3, are identical with calculations based on a plurality of calculation steps 41$a$ to 41$d$ executed by first calculation means 41 in the first microprocessor discussed above. Calculated output Do2 is introduced to comparator 42 and compared with Do1.

Comparator 42 compares calculated outputs Do1 and Do2. If the outputs disagree beyond the predetermined allowable conditions, the comparator judges the case as a transmitter failure, outputs alarm command AL, causes output selector 43 to switch to alarm signal generator 44, causes current output signal Io to go into a burnout state, and informs host computer 17 of the transmitter failure.

Numeral 45 denotes a self-diagnosis means for performing a fault diagnosis on pressure sensor 1 (frequency failure or the cessation of vibration in the case of vibrating sensors) or checking the microprocessor itself for a possible operational failure if the signal of counter 2 or 3 stops or if the transmitter output is lost or does not change for a specific period of time. If self-diagnosis means 45 detects any failure, it transmits signal Ds to output selector 43 to cause current output signal Io to go into a burnout state.

As a rule, two or more transmitters need to be used for a system for which safety is required, thus involving high instrumentation costs. If the sensor is highly reliable and therefore dual-redundancy is not required, the system may be configured so that the transmitter itself is singular and the internal signal processing function is duplicated, as illustrated in FIG. 1. According to this system configuration, it is possible to reduce the abovementioned costs, compared with the case when hardware is completely duplicated.

However, since second counter 3, second microprocessor 5, and memory means 9 to 11 are added as hardware components even in the transmitter configuration illustrated in FIG. 1, the cost problem is not completely solved. In addition, an increase in the number of hardware components constitutes an obstacle to downsizing transmitters.

SUMMARY OF THE INVENTION

An object of the present invention, therefore, is to realize a transmitter whose internal signal processing function can be duplicated without having to add any hardware components. The constitution of the present invention, in which the aforementioned object is achieved, is as follows:

(1) A transmitter for receiving an input of a process variable and converting the process variable into a predetermined output signal by executing a plurality of calculation steps, comprising a backward calculation means for advancing the plurality of calculation steps in the reverse direction of the normal flow thereof.

(2) The transmitter of item 1, further comprising a verification means for executing a judgment on agreement between the calculated values of the plurality of calculation steps and the calculated values determined in the respective steps of the backward calculation.

(3) The transmitter of item 2, wherein the verification means issues an error alarm upon the occurrence of at least one instance of disagreement during the judgment of agreement.

(4) The transmitter of item 2, wherein the verification means issues an error alarm upon the occurrence of the same instance of disagreement a plurality of times during the judgment of agreement.

(5) The transmitter of item 2, 3 or 4, wherein the verification means sets a predetermined error range during the judgment of agreement.

(6) The transmitter of item 2, 3, 4 or 5, wherein the steps of the backward calculation and the judgment of agreement are separately performed in the spare time slots of the plurality of calculation steps.

(7) The transmitter of item 1, 2, 3, 4, 5 or 6, wherein the input signal is supplied from a sensor as a digital value.

(8) The transmitter of item 7, wherein the sensor is a vibrating pressure sensor or a vibrating differential pressure sensor.

(9) A method for duplicating a transmitter, comprising the steps of:
forward calculation in order to convert an input signal into an output signal using a plurality of calculation steps;
backward calculation in order to execute the plurality of calculation steps in reverse direction; and
verification in order to execute the judgment of agreement between values calculated in the forward calculation steps and values calculated in the corresponding steps of the backward calculation steps.

(10) The transmitter duplication method of item 9, wherein an error alarm is issued upon the occurrence of at least one instance of disagreement in the verification step.

(11) The transmitter duplication method of item 9, wherein an error alarm is issued upon the occurrence of the same instance of disagreement a plurality of times in the verification step.

(12) The transmitter duplication method of item 9, 10 or 11, wherein the backward calculation steps and the verification step are separately executed in the spare time slots of the backward calculation steps.

DETAILED DESCRIPTION OF THE PREFERRED EMBODIMENTS

Figure 1:
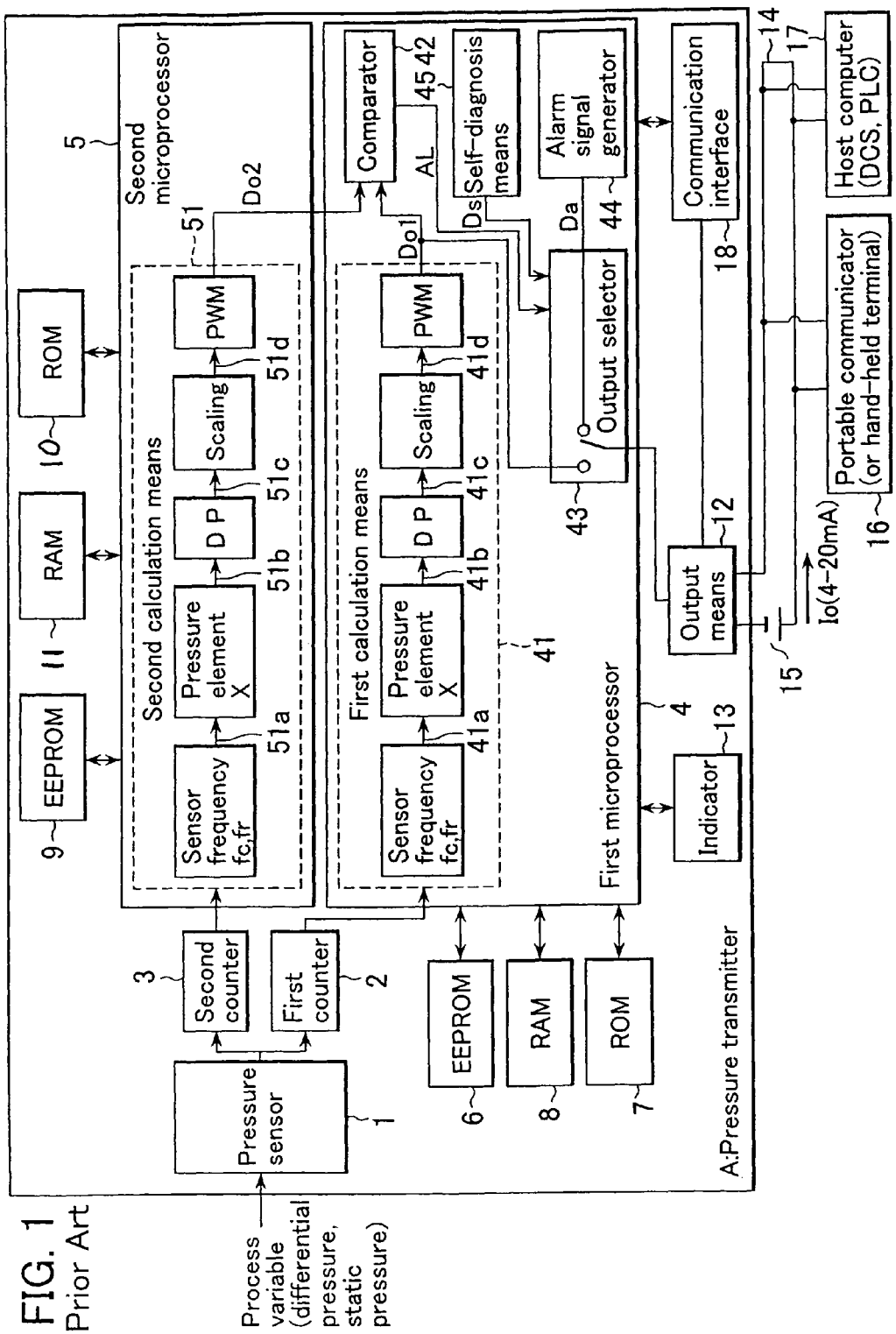
FIG. 1 is a functional block diagram illustrating an example of a prior art differential pressure transmitter having duplicated internal signal processing functions.
Figure 2:
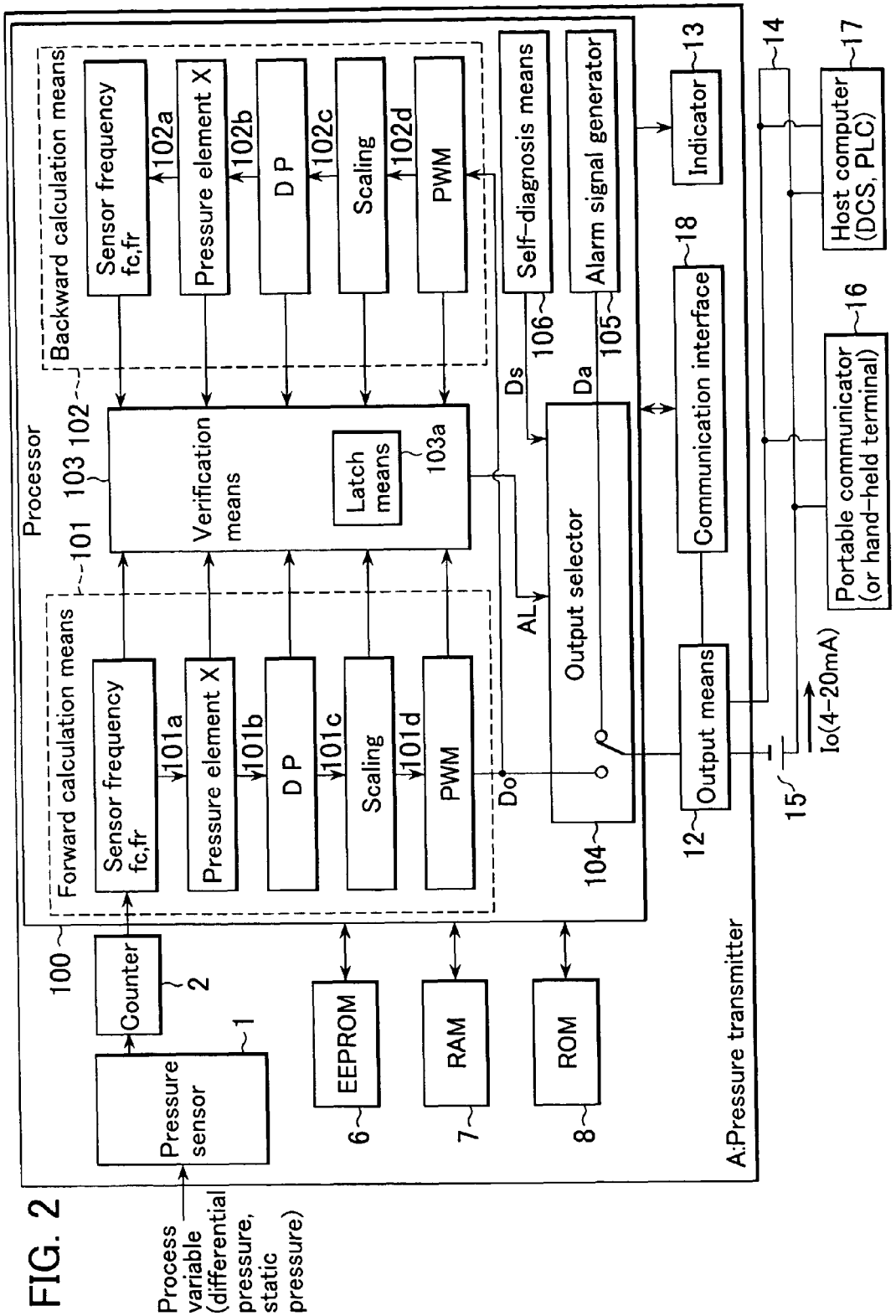
FIG. 2 is a functional block diagram illustrating one embodiment of a differential pressure transmitter to which the present invention has been applied.

Preferred embodiments of the present invention will hereinafter be described in detail with reference to the accompanying drawings, wherein FIG. 2 is a functional block diagram illustrating one embodiment of a differential pressure transmitter to which the present invention has been applied. In the figure, like components are denoted by like numerals as in the prior art transmitter illustrated in FIG. 1 and will not be explained further. An explanation will hereinafter be made specifically to the characteristic features of the present invention.

In FIG. 2, numeral 100 denotes a single microprocessor to which the present invention has been applied and to which pulse signals are input from a single unit of counter 2. In microprocessor 100, numeral 101 denotes a forward calculation means, wherein the calculation details and calculated output Do of a plurality of calculation steps 101a to 101d are completely identical with the calculation details and calculated output Do1 of steps 41a to 41d of first calculation means 41 in the prior art transmitter illustrated in FIG. 1.

Numeral 103 denotes a verification means, which includes latch means 103a for retaining calculated values obtained in each calculation step of forward calculation means 101 and verifies whether the calculated values agree with those obtained in each step of the backward calculation means being discussed later.

Numeral 102 denotes a backward calculation means specific to the present invention, wherein calculated output Do of forward calculation means 101 is input to backward calculation means 102 so that the respective calculation steps of forward calculation means 101 are advanced in the reverse direction of the normal calculation thereof. In other words, backward calculation means 102 executes backward calculation to process the calculation steps of forward calculation means 101 in reverse order, going back to the step for calculating frequency signals fc and fr. The value calculated in each backward calculation step is input to verification means 103 and compared with the value calculated in each corresponding forward calculation step and retained in latch means 103a.

Verification means 103 outputs alarm command AL to output selector 104 if any one of backward-calculated values exceeds an error range set for forward-calculated values and disagrees with the corresponding forward-calculated value during comparison between mutually corresponding steps, or if the same case of disagreement occurs the predetermined number of times. Output selector 104, alarm signal generator 105 and self-diagnosis means 106 are functionally the same as components 43 to 45 illustrated in FIG. 1 and are not explained further.

Equations for calculating the values of individual backward calculation steps will now be explained. Backward calculation step 102d for backward-calculating dpscaled' from pwm, which is forward-calculated output Do is executed according to the following equation:

$$dpscaled' = \frac{pwm - c_0}{\sum_{i=1}^{n} c_i \cdot dpscaled^i} \quad \text{(Eq. 2-4)}$$

Backward calculation step 102c for backward-calculating dpcomp' from dpscaled determined by forward calculation is executed according to the following equation:

$$dpcomp' = dpscaled(urv-lrv)+lrv \quad \text{(Eq. 2-3)}$$

Backward calculation step 102b for backward-calculating X' from dpcomp determined by forward calculation is executed according to the following equation:

$$X' = \frac{(dpcomp - k_0)}{\sum_{i=1}^{m} k_i \cdot x^i} \quad \text{(Eq. 2-2)}$$

Backward calculation step 102a for backward-calculating fc' from X determined by forward calculation is executed according to the following equation:

$$f_c^{2\prime} = \frac{X - B \cdot f_r^2 - C}{A} \quad \text{(Eq. 2-1)}$$

Figure 3:
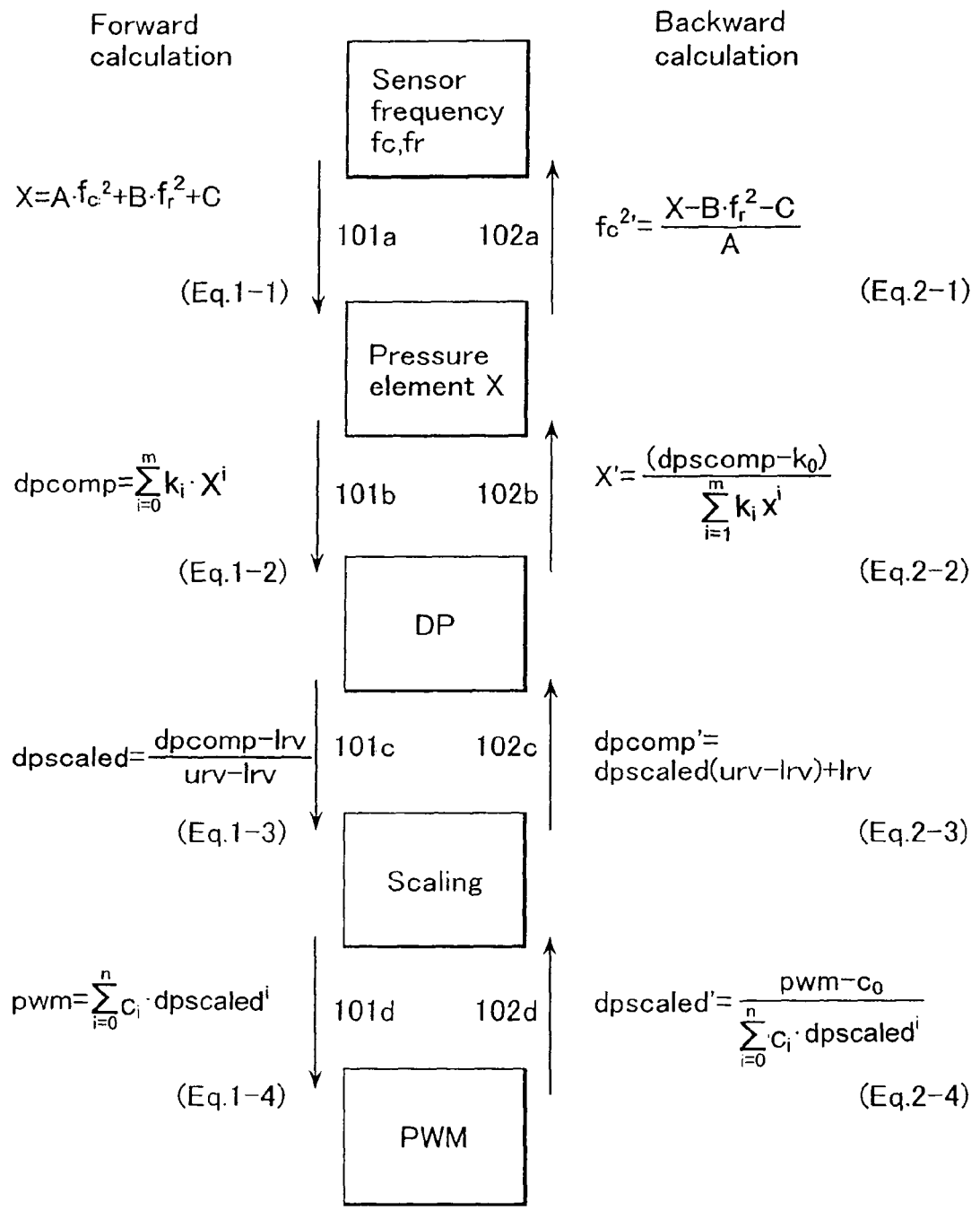
FIG. 3 is a graphical representation illustrating in a comparative manner the direction of processing and the equations applied to the steps of forward calculation and backward calculation.

FIG. 3 is a graphical representation illustrating in a comparative manner the direction of processing and the equations applied to forward and backward calculation steps. FIG. 3 is also an easy-to-understand visual representation of the functional composition of software-based dual-redundant processing in accordance with the present invention.

Next, conditions for verification means 103 to judge agreement between mutually corresponding calculation steps will be explained. Judgment conditions for calculated value dpscaled' of backward calculation step 102d are given by the following equation:

$$dpscaled-\alpha < dpscaled' < dpscaled+\alpha \quad \text{(Eq. 3-1)}$$

Judgment conditions for calculated value dpcomp' of backward calculation step 102c are given by the following equation:

$$dpcomp-\beta < dpcomp' < dpcomp+\beta \quad \text{(Eq. 3-2)}$$

Judgment conditions for calculated value X' of backward calculation step 102b are given by the following equation:

$$X-\chi < X' < X+\chi \quad \text{(Eq. 3-3)}$$

Judgment conditions for calculated value fc' of backward calculation step 102a are given by the following equation:

$$(f_c-\delta)^2 < f_c^{2\prime} < (f_c+\delta)^2 \quad \text{(Eq. 3-4)}$$

$\alpha$, $\beta$, $\chi$ and $\delta$ and in each condition-judging equation shown above are constants representative of an allowable error range for the judgment of agreement and are set to appropriate values according to calculation errors, the operating range of the transmitter, and accuracy.

Figure 4:
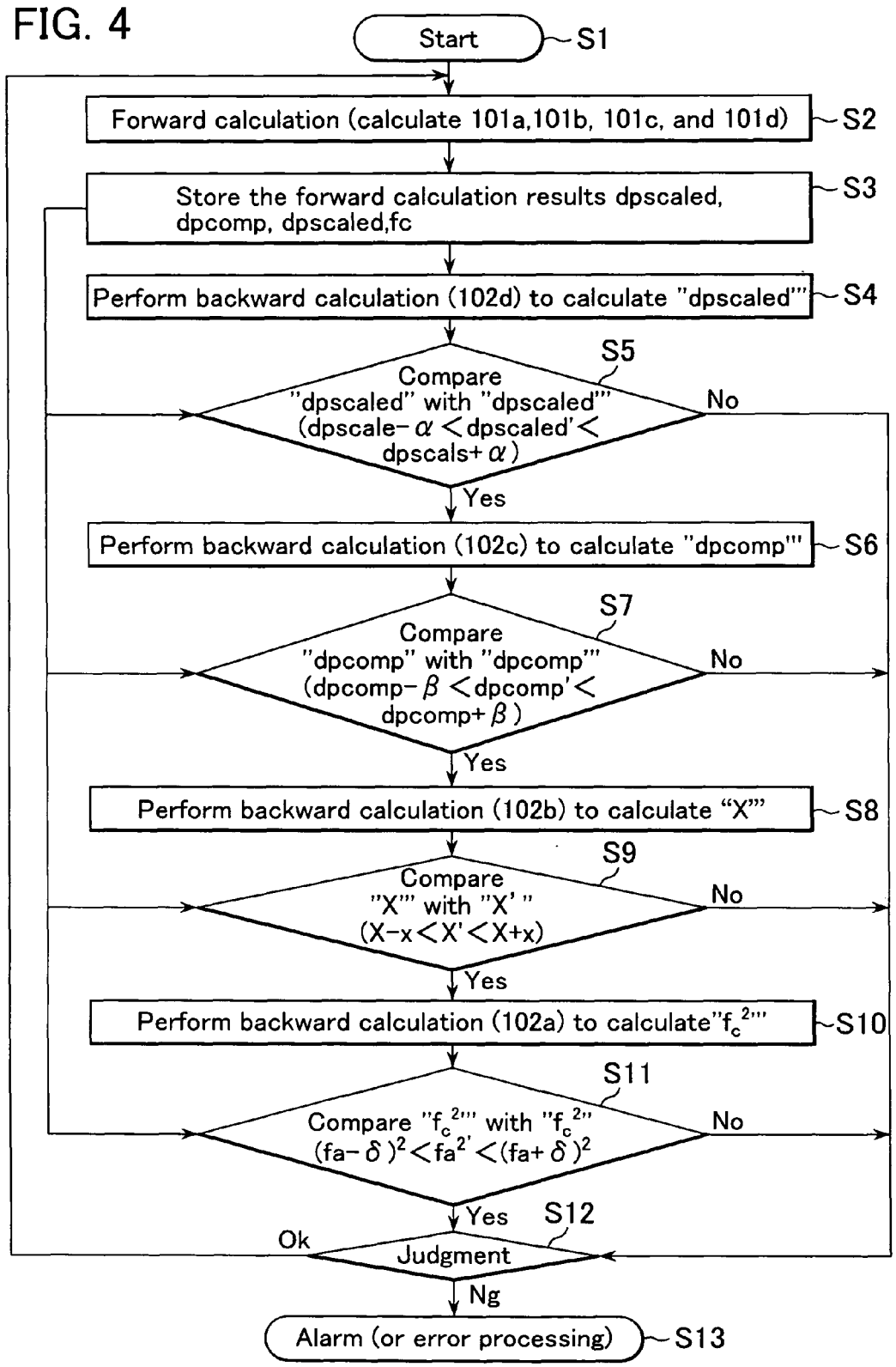
FIG. 4 is a flowchart illustrating a signal processing procedure in a software-based method of duplication.

FIG. 4 is a flowchart illustrating a signal processing procedure in a software-based method of duplication. Signal processing begins from step S1, individual forward calculation steps are executed in step S2, and the calculated values of these individual calculation steps are retained in step S3. The retained values are referenced in judgment steps S5, S7, S9 and S11.

In step S4, backward calculation step 102d is performed and dpscaled' is calculated and in step S5, a judgment is executed on the agreement of dpscaled' with forward-calculated value dpscaled. If the conditions of the judgment are satisfied, backward calculation step 102c is executed in step S6 to calculate dpcomp', and a judgment is executed on the agreement of dpcomp' with forward-calculated dpcomp in step S7.

If the conditions of the judgment are satisfied, backward calculation step 102b is executed in step S8 to calculate X', and a judgment is executed on the agreement of X' with forward-calculated value X in step S9. If the conditions of the judgment are satisfied, backward calculation step 102a is executed in step S10 to calculate fc', and a judgment is executed on the agreement of fc' with forward-calculated fc in step S11.

If the conditions of the judgment are satisfied, a comprehensive judgment is made in step S12. If the conditions of all these judgments of agreement are satisfied, the signal processing procedure results in "OK" (normal processing), and repeats the above-discussed routine. If disagreement is found in step S5, S7, S9 or S11, the signal processing procedure immediately jumps to step S12 for a comprehensive judgment and results in "NG" (error processing).

It is possible to apply an appropriate algorithm to the execution of error processing following the comprehensive judgment, such as starting error processing immediately upon the occurrence of any single instance of disagreement, starting error processing upon the occurrence of disagreement the predetermined number of times, or starting error processing upon the occurrence of the same disagreement the predetermined number of times.

In the flowchart illustrated in FIG. 4, an example has been described in which branch processing is executed and a comprehensive judgment is executed according to the result of the judgment of agreement in each step of backward calculation. Alternatively, it is possible to adopt a method in which information on the results of the judgment of agreement in such each step is first retained, then a comprehensive judgment is executed according to all this information without executing branch processing.

Figure 5:
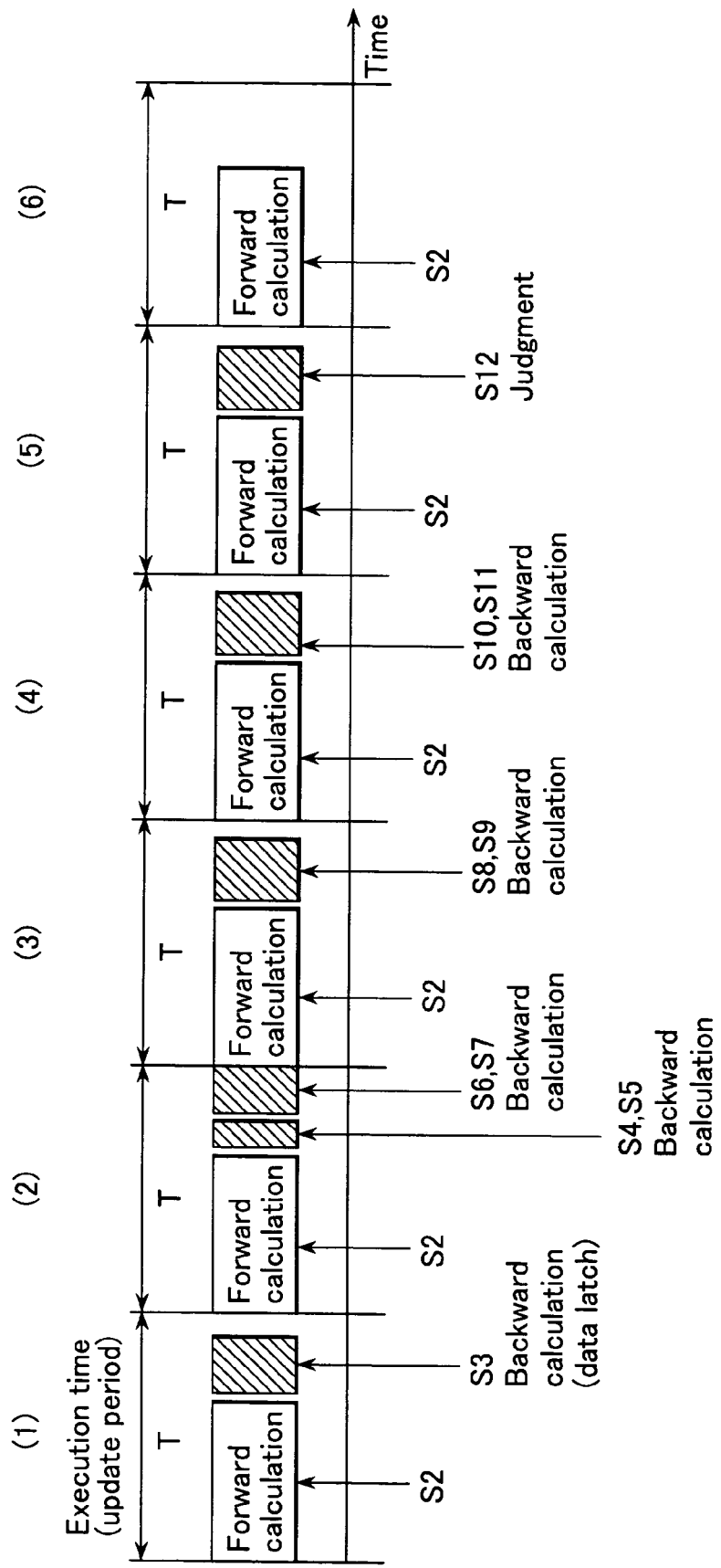
FIG. 5 is a timing chart illustrating a timing relationship between forward calculation and backward calculation.

FIG. 5 is a timing chart illustrating a timing relationship between forward calculation and backward calculation. T denotes an execution time, which is constant and no greater than 100 msec. In each execution time, step 52 represents a forward calculation time corresponding to step S2 in the flowchart illustrated in FIG. 4, and is designed to be approximately two-thirds the length of execution time T. Forward calculation is completed during each execution time.

On the other hand, backward calculation is performed with the steps thereof separately executed in each spare time slot as long as one-third the length of each execution time.

The time length of backward calculation whose steps are executed separately during each execution time is approximately one-tenth the length of execution time T.

In first execution time (1), backward calculation step S3 is executed during the period depicted by hatching and, in second execution time (2), backward calculation steps S4 and S5, and then S6 and S7, are executed.

In third execution time (3), backward calculation steps S8 and S9 are executed; in fourth execution time (4), backward calculation steps S10 and S11 are executed; and in fifth execution time (5), judgment step S12 is executed for comprehensive judgment.

In sixth execution time (6), only forward calculation step S2 is executed and backward calculation comes to a pause. This pause is inserted cyclically at an interval of, for example, one second.

As described above, by executing backward calculation steps separately by taking advantage of the spare time slots of forward calculation (whenever such spare times are found), it is possible to realize a transmitter in which a response delay does not occur even if such backward calculation steps as discussed above are added.

Although in the embodiments of the transmitter discussed above in accordance with the present invention, a pressure or differential pressure transmitter has been described as an example, the scope of application of the present invention is not limited to these embodiments. Rather, the present invention may commonly be applied to transmitters of such types that input signals are converted into output signals by executing a plurality of calculation steps.

As described above, the following advantageous effects are achieved according to the present invention:

(1) By executing a plurality of calculation steps in reverse direction and comparing the result of each such backward calculation with the calculated value of each corresponding forward calculation step by means of software-based signal processing on a single piece of hardware, it is possible to realize a function equivalent to duplicating the hardware for verifying calculated outputs. Consequently, it is possible to provide a small, low-cost, highly versatile transmitter usable for both safety instrumentation and general instrumentation purposes.

(2) By placing the highest priority on forward calculation and dividing backward calculation (recalculation) into blocks of divisional processing so that backward calculation steps are allocated in small units to the spare time slots of the forward calculation, it is possible to provide a high-speed transmitter having no response delay as a whole.

What is claimed is:

1. A transmitter for receiving an input of a process variable and converting said process variable into a predetermined output signal by executing a plurality of calculation steps, comprising:

a backward calculation means for executing backward calculation of each ordinary calculation step based on the variable calculated at each of said plurality of steps, in addition to a forward calculation means for executing calculation of said plurality of steps;

said output signal is given in digital value by a sensor;

said sensor is a vibrating differential pressure or a pressure sensor;

said backward calculation steps having the following steps:

for each step of said plurality of steps, using correction factor $c_i$, scaled differential pressure dpscaled, and calculated value output pwm calculated by said forward calculation means, calculating scaled differential pressure dpscaled' using Equation (1) below, for each step of said plurality of steps, using differential pressure dpcomp that has been corrected in temperature and static pressure and ranges urv and lrv, and said scaled differential pressure dpscaled which has been calculated by said forward calculating means, calculating differential pressure dpcomp', which has been corrected in temperature and static pressure, using Equation (2) below, for each step of said plurality of steps, using correction factor $k_i$, differential pressure signal X, and said differential pressure dpcomp which has been corrected in temperature and static pressure calculated by said forward calculating means, calculating differential pressure signal X', using Equation (3) below, for each step of said plurality of steps, using sensor frequencies fc, fr, constants A, B and C, and said differential pressure signal X calculated by said forward calculating means, calculating sensor frequency fc' using Equation (4) below, $$dpscaled' = \frac{pwm - c_0}{\sum\limits_{n} c_i \cdot dpscaled^i} \qquad \text{Equation 1}$$

$$dpcomp' = dpscaled(urv - lrv) + lrv \qquad \text{Equation 2}$$

$$X' = \frac{(dpcomp - k_0)}{\sum\limits_{i=1}^{m} k_i \cdot x^i} \qquad \text{Equation 3}$$

$$fc^{2\prime} = \frac{X - B \cdot fr^2 - C}{A} \qquad \text{Equation 4}$$

$c_i$ is a dynamic correction factor having temperature dependence, urv and lrv are user-specified ranges of 100% and 0%, $k_i$ is a dynamic correction factor dependent on temperature and static pressure, and A, B and C are constants which represent sensor characteristics.

2. The transmitter of claim 1, having verification means for executing a judgment of agreement between the calculated values determined in each step of said plurality of steps and the calculated values determined in each step of said backward calculation.

3. The transmitter of claim 2, wherein said verification means issues an error alarm upon the occurrence of at least one instance or more of disagreement during the judgment of agreement.

4. The transmitter of claim 2, wherein said verification means issues an error alarm upon the occurrence of the same instance of disagreement a plurality of times during the judgment of agreement.

5. The transmitter according to claim 2, 3 or 4, wherein said verification means sets a predetermined error range during the judgment of agreement based on said calculation error, the range of motion of said transmitter, and precision.

6. The transmitter according to claim 2, 3 or 4, wherein the steps of said backward calculation and said judgment of agreement are separately performed in the spare time slots in calculation consisting of said plurality of steps, and stop periodically.

7. The transmitter of claim 5, wherein the steps of said backward calculation and said judgment of agreement are separately performed in the spare time slots in calculation consisting of said plurality of steps, and stop periodically.

8. A method for duplicating a transmitter, having the following characteristics:
   a forward calculation step to convert an input signal into an output signal using plurality of calculation steps;
   a backward calculation step in order to calculate a backward calculation of each ordinary calculation step, the value of which has been calculated in each of said plurality of steps; and
   a verification step in order to execute the judgment of agreement between values calculated in said forward calculation steps and values calculated in the corresponding steps of said backward calculation steps;
   said input signal is given in digital value by sensor;
   said sensor is a vibrating differential pressure or pressure sensor,
   said backward calculation steps having the following steps:
   for each step of said plurality of steps, using correction factor $c_i$, scaled differential pressure dpscaled, and calculated value output pwm calculated by said forward calculation steps, calculating scaled differential pressure dpscaled' using Equation (5) below,
   for each of said plurality of steps, using differential pressure dpcomp that has been amended in temperature and static pressure and ranges urv and lrv, and said scaled differential pressure dpscaled which has been calculated by said forward calculating means, calculating differential pressure dpcomp', which has been corrected in temperature and static pressure, using Equation (6) below;
   for each of said plurality of steps, using correction factor $k_i$, differential pressure signal X, and said differential pressure dpcomp which has been corrected in temperature and static pressure calculated by said forward calculating step, calculating differential pressure signal X', using Equation (7) below,
   for each of said plurality of steps, using sensor frequencies fc, fr, constants A, B and C, and said differential pressure signal X' calculated by said forward calculating step, calculating sensor frequency fc' using Equation (8) below, $$dpscaled' = \frac{pwm - c_0}{\sum\limits_{n} c_i \cdot dpscaled^i} \qquad \text{Equation 5}$$

$$dpcomp' = dpscaled(urv - lrv) + lrv \qquad \text{Equation 6}$$

$$X' = \frac{(dpcomp - k_0)}{\sum\limits_{i=1}^{m} k_i \cdot x^i} \qquad \text{Equation 7}$$

$$fc^{2\prime} = \frac{X - B \cdot fr^2 - C}{A} \qquad \text{Equation 8}$$

$c_i$ is a dynamic correction factor having temperature dependence, urv and lrv are user-specified ranges of 100% and 0%, $k_i$ is a dynamic correction factor dependent on temperature and static pressure, and A, B and C are constants which represent sensor characteristics.

9. The method for duplicating a transmitter of claim 8, wherein an error alarm is issued upon the occurrence of at least one instance or more of disagreement in said verification step.

10. The method for duplicating a transmitter of claim 8, wherein an error alarm is issued upon the occurrence of the same instance of disagreement a plurality of times in said verification step.

11. The method for duplicating a transmitter according to claim 8, 9 or 10, wherein said backward calculation steps and said verification step are separately executed in the spare time slots of said forward calculation steps, and stop periodically.

* * * * *